(12) United States Patent
Katayama et al.

(10) Patent No.: US 7,133,961 B2
(45) Date of Patent: Nov. 7, 2006

(54) NON-VOLATILE MEMORY CARD AND TRANSFER INTERRUPTION MEANS

(75) Inventors: Kunihiro Katayama, Chigasaki (JP); Motoki Kanamori, Tachikawa (JP); Atsushi Shikata, Higashimurayama (JP); Hidefumi Oodate, Kodaira (JP); Atsushi Shiraishi, Kodaira (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 283 days.

(21) Appl. No.: 10/195,400

(22) Filed: Jul. 16, 2002

(65) Prior Publication Data

US 2003/0051094 A1  Mar. 13, 2003

(30) Foreign Application Priority Data

Sep. 12, 2001 (JP) ............................. 2001-276002

(51) Int. Cl.
*G06F 12/00* (2006.01)
(52) U.S. Cl. .................. 711/103; 711/100; 711/115; 711/163; 710/32; 710/36; 710/260
(58) Field of Classification Search ................ 711/103, 711/115, 154, 156, 167
See application file for complete search history.

(56) References Cited

U.S. PATENT DOCUMENTS 5,740,404 A * 4/1998 Baji ........................... 711/167
6,438,068 B1 * 8/2002 Roohparvar ............. 365/238.5
2003/0028806 A1 * 2/2003 Govindarajan et al. ..... 713/201
2003/0172229 A1 * 9/2003 Takasugi et al. ............ 711/112

* cited by examiner

*Primary Examiner*—Pierre Vital
*Assistant Examiner*—Midys Rojas
(74) *Attorney, Agent, or Firm*—Miles & Stockbridge PC

(57) ABSTRACT

A memory card is provided with a transfer control circuit, a write control circuit and a judging circuit. The transfer control circuit outputs a transfer flag signal during the data transfer. The write control circuit outputs an internal busy signal during the data write operation. The judging circuit outputs a transfer interruption signal when a card selection signal of the host is negated during the input of the transfer flat signal and also outputs a suspension signal when the card selection signal is negated during the input of the internal busy signal. A CPU invalidates the data being transfer to interrupt the transfer process upon reception of the transfer interruption signal and completes, upon reception of the suspension signal, the process being executed and stays in the waiting condition. Consequently, even when the timing signal not conforming to the standards is transferred, the host can select the optimum processing operation from the internal processing conditions and thereby execute the selected operation.

7 Claims, 6 Drawing Sheets

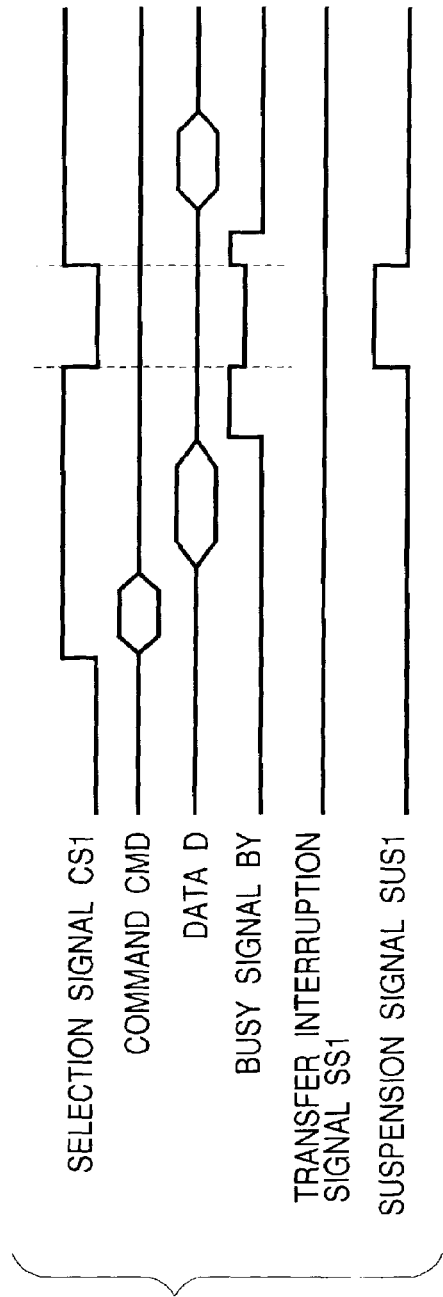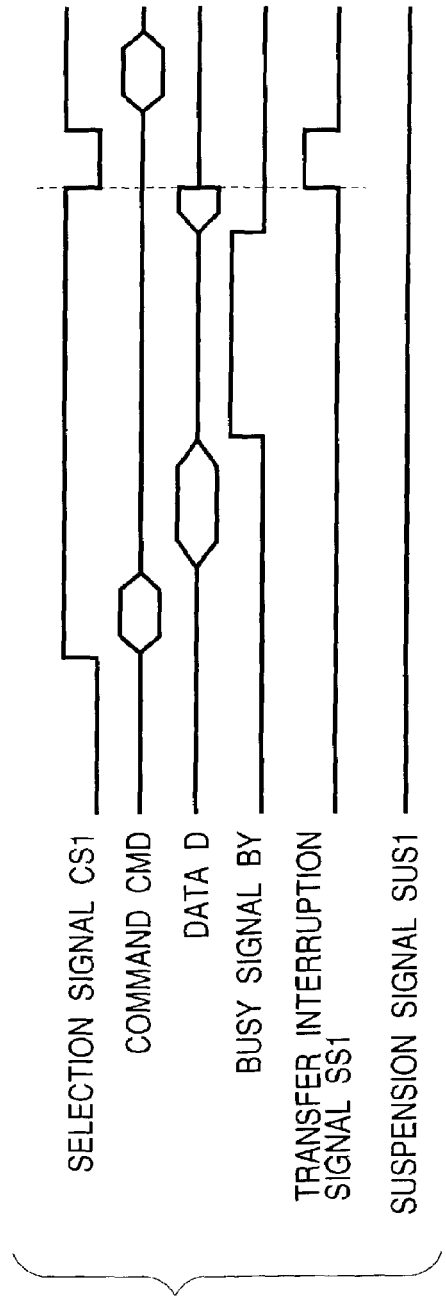
FIG. 4
FIG. 5

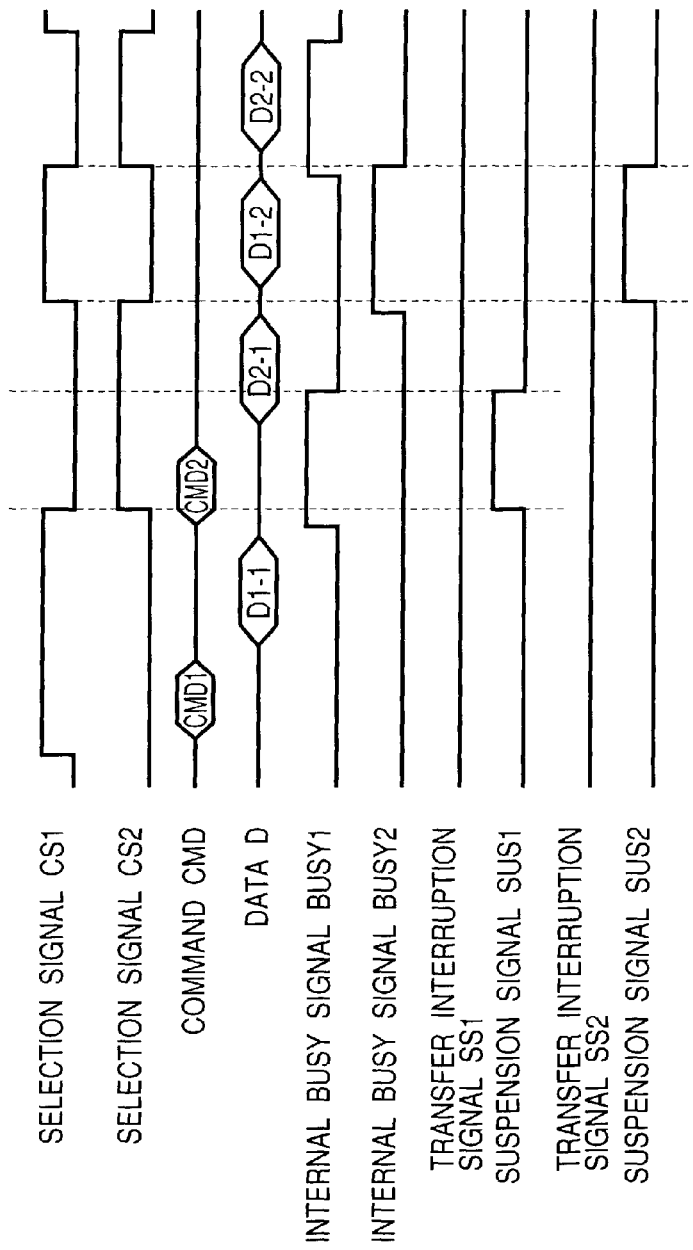

NON-VOLATILE MEMORY CARD AND TRANSFER INTERRUPTION MEANS

BACKGROUND OF THE INVENTION

The present invention relates to a nonvolatile memory card and particularly to a technique which may be effectively adapted to flexible application such as alteration and addition of standards of a multimedia card.

A multimedia card is widely known as one of external storage media of a personal computer and a multifunction terminal equipment or the like. This multimedia card is applicable to every kind of digital information pieces in the recording of a still video image of a digital video camera, data of a mobile phone and music data of mobile player.

This multimedia card can maintain its compatibility with the multimedia card standards specified by MMCA (Multi-Media Card Association) which is a standardization organization.

A multimedia card has been produced through expansion of the Internet and spread of mobile phones and therefore it is not a traditional product. Moreover, in some cases, the multimedia card standards do not specify the measure for operations such as unexpected violation for the standards by a host side.

The inventors of the present invention have discussed an event that a card selection signal (CS) is negated during execution of access based on a command issued from the host in the operation mode wherein the multimedia card selected with the card selection signal generated by the host accepts the command and then executes the process.

As the process in the multimedia card to be executed as explained above, it is thought that the data input and data output are masked and the processes within the multimedia card are continued so long as a clock signal is inputted.

SUMMARY OF THE INVENTION

However, the inventors of the present invention have also found existence of the problem in the operation process of the memory card when a card selection signal as explained above is negated.

Namely, when the card selection signal is asserted again after it is once negated, the multimedia card can continue the processing operations even while the card selection signal is being negated.

On the other hand, since it is difficult to grasp the operations of card under the non-selected condition, when the card selection signal is asserted again, the host has an anxiety that it cannot control the multimedia card because the processes in the host and multimedia card are asynchronized.

It is therefore an object of the present invention to provide a memory card which can select the optimum processing operations from the internal processing conditions and then execute this selected processing operation even when a timing signal, which is not recognized by the host based on the standardization, is transferred.

The aforementioned object and the other objects of the present invention and novel features thereof will become apparent from description of the present specification and the accompanying drawings.

The typical inventions among those disclosed in the present specification will be briefly explained below.

1. Namely, the memory card of the present invention is provided with a process judging means which outputs an interruption signal when the card selection signal is negated from the asserted state while the host transfers the data to a controller which instructs operations of a non-volatile semiconductor memory based on the command issued from the host. Accordingly, when the process judging means outputs the interruption signal, the memory card invalidates all data being transferred and interrupts the transfer process.

2. Moreover, in the item 1, the process judging means is composed of a transfer control unit to detect that the data is being transferred and output a transfer flag signal and a process judging unit for receiving the transfer flag signal outputted from the transfer control unit and the card selection signal and outputting the interruption signal when the card selection signal is negated from the asserted state while the transfer flag signal is being inputted.

Moreover, the other inventions of the present specification will be briefly explained below.

1. This memory card is provided with a process judging means which outputs a suspension signal to the controller for instructing operations of the nonvolatile semiconductor memory based on the command issued from the host when the card selection signal is negated from the asserted state during execution of the transferred command. Accordingly, when the process judging means outputs the suspension signal, the memory card executes a command without relation to the state of card selection signal and thereafter stays in the waiting condition before the data transfer.

2. In the memory card explained in the item 1, the process judging means is composed of a command control unit for outputting an operation signal during execution of the command and a process judging unit for receiving the operation signal outputted from the command control unit and the card selection signal and outputting the suspension signal when the card selection signal is negated from the asserted state during input of the operation signal.

3. In the memory card of item 2, a command is composed of, when the command control unit outputs the operation signal, at least any one of the read command, write command or erase command.

4. The memory card comprises: the transfer control unit which outputs, by detecting that the data is being transferred from the host, the transfer flag signal to the controller which instructs operation of the non-volatile semiconductor memory based on the command issued from the host; the command control unit for outputting the operation signal during execution of the command transferred from the host; and the process judging unit for receiving the transfer flag signal outputted from the transfer control unit and the card selection signal and outputting the interruption signal when the card selection signal is negated from the asserted state during input of the transfer flag signal and also receiving the operation signal outputted from the command control unit and the card selection signal, and outputting the suspension signal when the card selection signal is negated from the asserted state during the input of the operation signal. Accordingly, when the process judging unit outputs the interruption signal, the controller invalidates all data being transferred to suspend the transfer process. Moreover, when the process judging unit outputs the suspension signal, the controller executes the command without relation to the state of card selection signal and thereafter stays in the waiting condition before the data transfer.

5. In the memory card of the item 4, the command is composed of, when the command control unit outputs the operation signal, at least any one of the read command, write command or erase command.

BRIEF DESCRIPTION OF THE DRAWINGS

FIG. 4 is a timing chart showing an example of the signal timing in the memory card when the host in the preferred embodiment of the present invention has outputted a card selection signal not conforming to the standards.

FIG. 5 is a timing chart showing another example of the signal timing in the memory card when the host in the preferred embodiment of the present invention has outputted a card selection signal not conforming to the standards.

FIG. 9 is a timing chart showing an example of the operation timing in the memory card of FIG. 1.

DETAILED DESCRIPTION OF THE PREFERRED EMBODIMENTS

The preferred embodiments of the present invention will be explained in detail with reference to the accompanying drawings.

Figure 1:
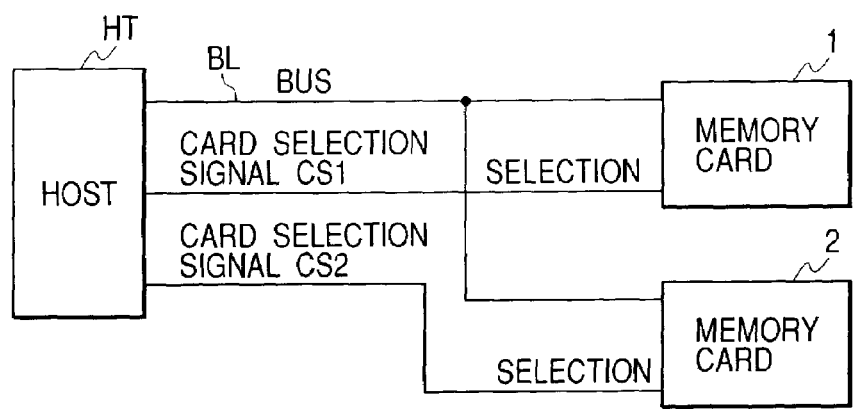
FIG. 1 is a block diagram of a memory card connected to a host as one embodiment of the present invention.
Figure 2:
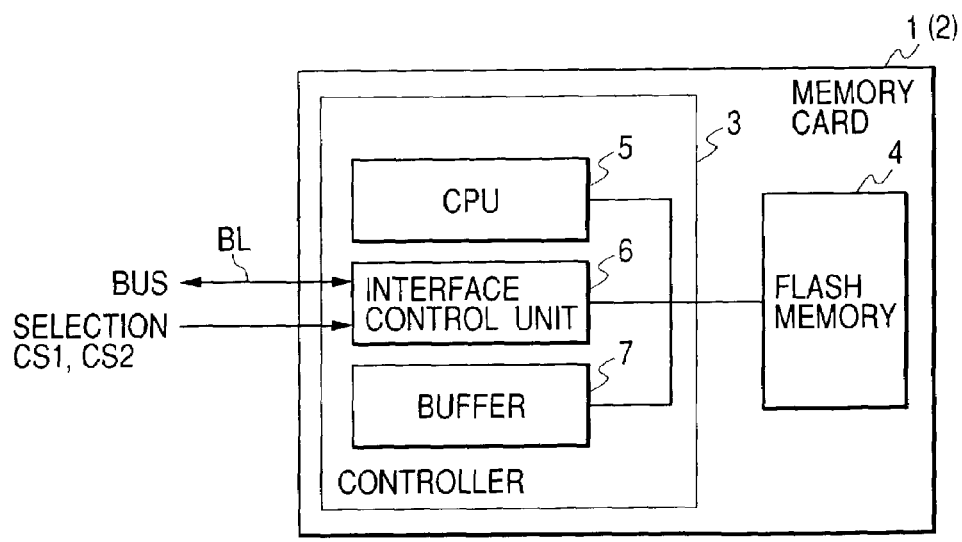
FIG. 2 is a block diagram of the memory card of FIG. 1.
Figure 3:
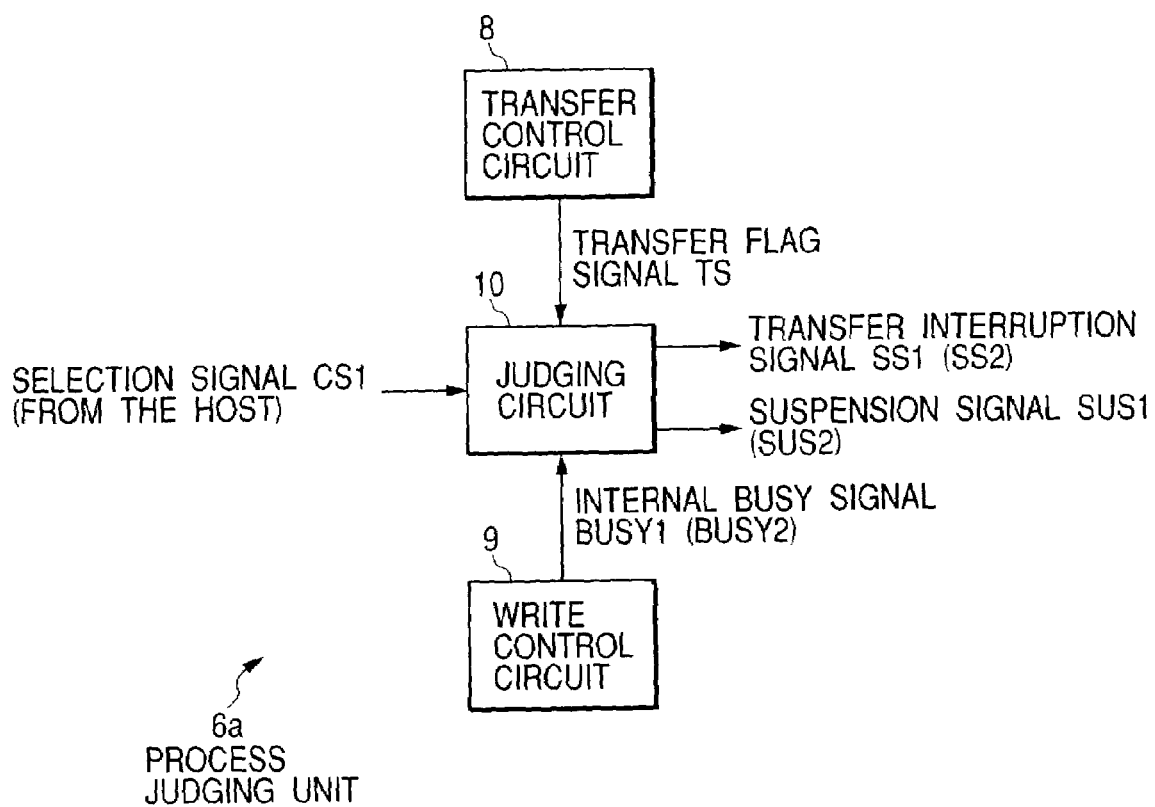
FIG. 3 is a block diagram of a process judging unit provided in the memory card of FIG. 2.

FIG. 1 is a block diagram of a memory card connected to a host as a preferred embodiment of the present invention. FIG. 2 is a block diagram of the memory card of FIG. 1. FIG. 3 is a block diagram of a process judging unit provided in the memory card of FIG. 2. FIG. 4 to FIG. 7 are timing charts showing respective examples of the signal timings in the memory card when the host in the preferred embodiment of the present invention has outputted a card selection signal not conforming to the standards. FIG. 8 is a state transition diagram of the memory card in the signal timings of FIG. 4 to FIG. 7. FIG. 9 is a timing chart showing an example of the operation timing in the memory card of FIG. 1.

In the preferred embodiment of the present invention, a host HT in digital video camera, mobile phone, mobile music player and personal computer is connected, as shown in FIG. 1, with memory cards 1, 2 as external storage media. These memory cards 1, 2 are respectively composed of a multimedia card.

These memory cards 1, 2 are connected to the host HT via the common bus BL. Various signals such as command, data and clock are transferred via this bus BL.

Moreover, when the host HT makes access to the memory cards 1, 2, the host HT outputs the card selection signals CS1, CS2, each one of which is connected to the memory card 1 or 2. For example, when the host HT makes access to the memory card 1, a card selection signal CS1 is inputted to the memory card 1 and when the host HT makes access to the memory card 2, a card selection signal CS2 is inputted to the memory card 2.

In addition, the memory card 1 (or 2) is composed, as shown in FIG. 2, of a controller 3 and a flash memory 4. The controller 3 controls the flash memory 4 based on a command or the like received from the host HT in order to read a program or a data stored in the flash memory 4, execute the predetermined processes and instruct a data write operation. The flash memory 4 is a non-volatile semiconductor memory which can electrically update or delete the data.

Moreover, the controller 3 is composed of a CPU 5, an interface control unit 6 and a buffer 7 or the like. The CPU 5 executes the predetermined processes, in order to control every operations of the controller 3, conforming to a control program stored in the non-volatile memory such as ROM (Read Only Memory) or EEPROM (Electrically Erasable and Programmable ROM) or the like provided in the CPU 5.

The interface control unit 6 receives a command, from the host HT, to instruct the operations such as write/read/erase operation and also inputs or outputs the data required for such operation.

Moreover, the buffer 7 temporarily stores the data inputted or outputted to or from the host HT and flash memory 4.

The interface control unit 6 is also provided, as shown in FIG. 3, with a process judging unit (process judging means) 6a. This process judging unit 6a is composed of a transfer control circuit (transfer control unit) 8, a write control circuit (command control unit) 9 and a judging circuit (process judging unit) 10.

The transfer control circuit 8 controls data transfer in the memory card 1 (or 2) and outputs a transfer flag signal TS to the judging circuit 10 during data transfer. The write control circuit 9 generates an internal busy signal (operation signal) BUSY1 (or BUSY2) while the memory card 1 (or 2) executes the data write operation and then outputs this internal busy signal BUSY1 to the judging circuit 10.

The judging circuit 10 outputs a transfer interruption signal SS1 (or SS2) and a suspension signal SUS1 (or SUS2) to the CPU5 based on the card selection signal CS1 (or CS2), transfer flag signal TS and internal busy signal BUSY1 (BUSY2) inputted from the host HT.

Next, in regard to the memory card 1 of the embodiment of the present invention, operations of the interface control unit 6 due to transition of the card selection signal CS1 not conforming to the memory card standards will be explained with reference to the state transition diagram of FIG. 8 using the timing charts of FIG. 4 to FIG. 7.

Here, the timing charts of FIG. 4 to FIG. 7 respectively show the timings of the signals, from the upper side to the lower side, of the card selection signal CS1 transferred from the host HT, command CMD transferred from the host HT, data D transferred from the host HT, busy signal BY outputted to the host HT from the memory card 1, transfer interruption signal SS1 outputted from the memory card 1 and suspension signal SUS1 outputted from the memory card 1. Moreover, the memory card 1 is explained here but the memory card 2 also operates as explained above.

In FIG. 4, the card selection signal CS1 of the host HT is negated during write operation of data D in the multi-transfer mode. Moreover, a dotted line of the busy signal BY indicates the actual write operation of the memory card 1.

First, when the card selection signal CS1 is transferred to the memory card 1 from the host HT (state 1), the data write command CMD is subsequently transferred and the memory card 1 is in the condition to wait for the data transfer (state 2). Thereafter, the host HT conducts the first transfer of write data D (transfer of the first block) (state 3).

Upon reception of data D from the host HT, the memory card 1 outputs the busy signal BY(Hi) indicating write operation of data to the host HT to conduct the write operation of data D (state 4).

If the card selection signal CS1 transferred from the host HT is negated with a certain reason during the write operation of data D (state 5), the memory card 1 outputs the busy signal BY (high impedance condition) of an intermediate level to the host HT.

In this case, the judging circuit 10 outputs the suspension signal SUS1 to the CPU5 while the card selection signal CS1 is negated and the memory card 1 is writing data D (busy). The CPU5 having detected the suspension signal SUS1 continues the write operation, even if the card selection signal CS1 is negated, until the write operation of data D is completed (state 6) Here, since the card selection signal CS1 of the host HT is asserted during the write operation of the data D, the judging circuit 10 suspends output of the suspension signal SUS1 by receiving the asserted card selection signal CS1 to assure the ordinary operation of the memory card 1.

When the first write operation of data D is completed, the busy signal BY is cancelled and a ready signal appears, the host HT conducts the second data transfer (transfers the second block).

In FIG. 5, the card selection signal CS1 is negated during transfer of data D from the host HT in the multi-transfer mode.

In this case, the card selection signal CS1 is transferred to the memory card 1 from the host HT, the data write command CMD is then transferred (state 1) and thereafter the first input of data D is conducted (states 2 and 3).

Upon completion of transfer of data D from the host HT, the memory card 1 outputs the busy signal BY (Hi) indicating the data write operation to the host HT to conduct the data D write operation (state 4).

When the write operation of data D is completed, the busy signal BY is cancelled and a ready signal appears, followed by the condition to wait for the transfer of data D (state 2), the host HT conducts the second transfer of data (state 3). When the card selection signal CS1 of the host HT is negated with a certain reason during the transfer of data D (state 7), the judging circuit 10 outputs the transfer interruption signal SS1 to the CPU5.

Therefore, the judging circuit 10 outputs the transfer interruption signal SS1 when both card selection signal CS1 and the transfer flag signal TS of the transfer control circuit 8 are negated.

Upon detection of this transfer interruption signal SS1, the CPU5 invalidates all data D being transferred and interrupts the internal processes. Thereby, it can be prevented that the data D is received again when the card selection signal CS1 is asserted again.

Figure 6:
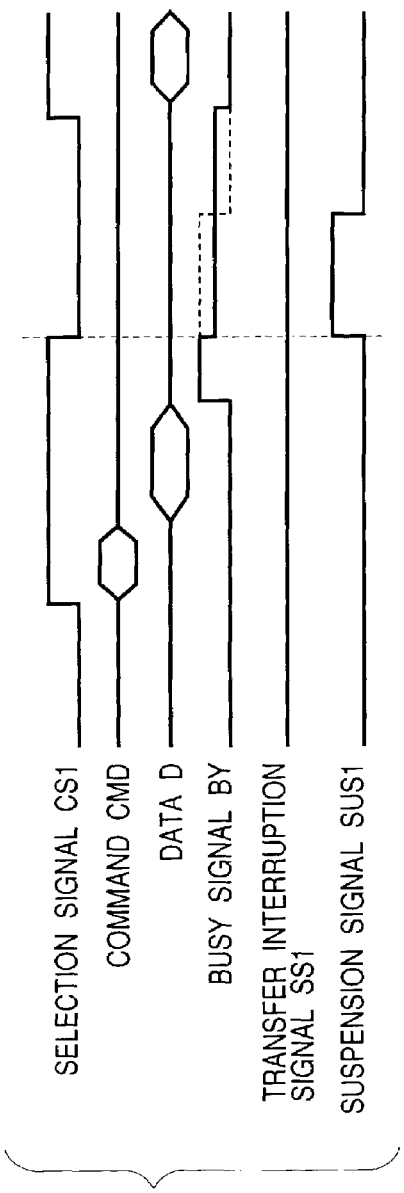
FIG. 6 is a timing chart showing an example of the signal timing in the memory card when the host in the preferred embodiment of the present invention has outputted a card selection signal not conforming to the standards.

Moreover, in FIG. 6, the write operation of data D is completed while the card selection signal CS1 is negated. In FIG. 6, as in the case of FIG. 4, the dotted line of the busy signal BY indicates the actual write operation of the memory card 1.

The card selection signal CS1 is transferred to the memory card 1 from the host HT and the data write command CMD is also transferred thereto (state 1). Thereafter, the first input of data D is executed (states 2, 3). Upon reception of the data D, the memory card 1 outputs the busy signal BY indicating the data write operation to the host HT to conduct the write operation of data D (state 4).

When the card selection signal CS1 of the host HT is negated during write operation of data D (state 5) the memory card 1 outputs the busy signal BY of intermediate level to the host HT.

Simultaneously, the judging circuit 10 outputs the suspension signal SUS1 to the CPU5. Upon reception of the suspension signal SUS1, the CPU5 continues the write operation until the end of write operation of data D even when the card selection signal CS1 is negated (state 6).

Here, the judging circuit 10 also outputs the suspension signal SUS1 when the card selection signal CS1 is negated and the memory card 1 is writing the data D (busy state).

When write operation of data D is completed, the judging circuit 10 suspends output of the suspension signal SUS1 even if the card selection signal CS1 is negated. The memory card 1 stays in the holding condition after the end of write operation of data until the card selection signal CS1 is asserted.

When the card selection signal CS1 of the host HT is asserted again, the memory card 1 returns to the ordinary operation mode to input the data write command CMD and the data D.

Figure 7:
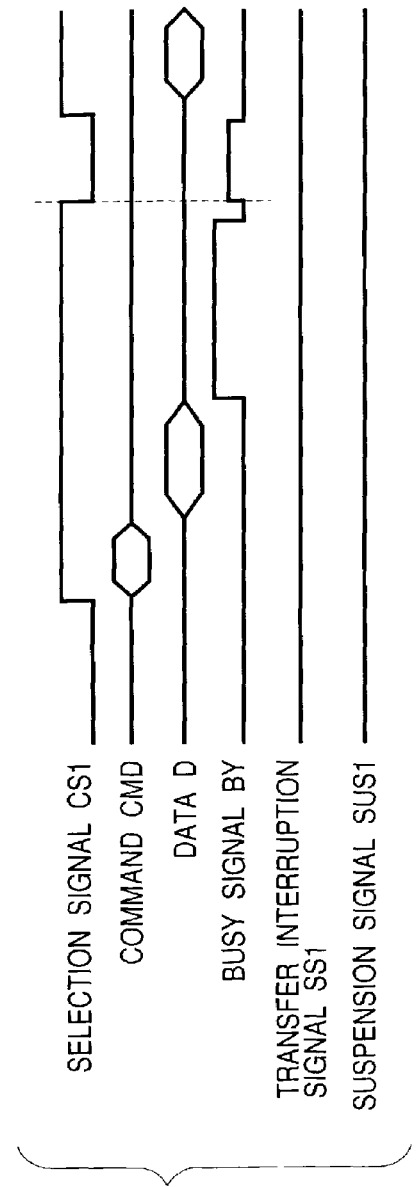
FIG. 7 is a timing chart showing another example of the signal timing in the memory card when the host in the preferred embodiment of the present invention has outputted a card selection signal not conforming to the standards.
Figure 8:
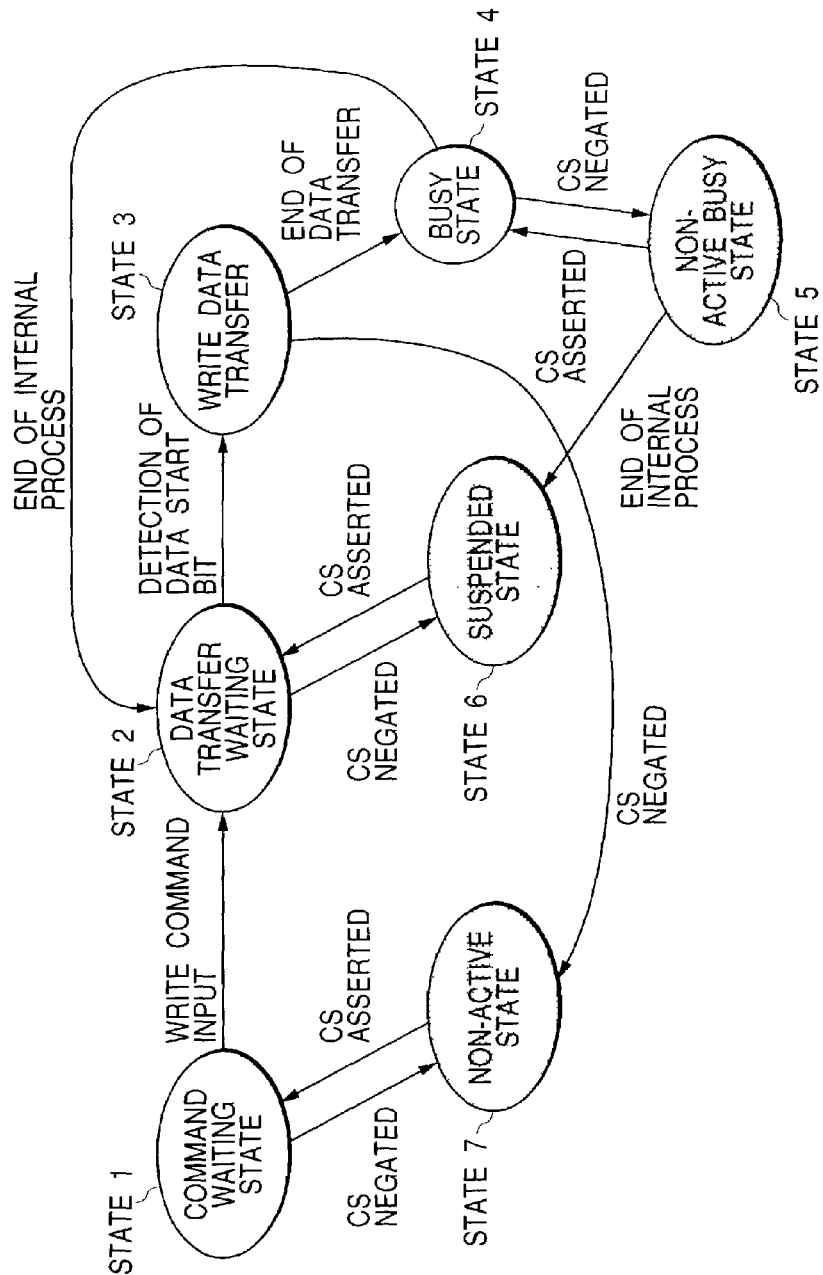
FIG. 8 is a state transition diagram of the memory card in the signal timings of FIG. 4 to FIG. 7.

Moreover, in FIG. 7, the card selection signal CS1 is negated when the host HT conducts the second transfer of data D after the end of the first write operation of data D.

The asserted card selection signal CS1 and the data write command are transferred to the memory card 1 from the host HT. Thereafter, the first write data D (first block) is inputted.

Upon reception of data D from the host HT, the memory card 1 outputs the busy signal BY indicating that the data write operation is being conducted to the host HT to conduct the write operation of data D.

When write operation of data D is completed, the busy signal BY is cancelled and a ready signal appears. Thereafter, when the card selection signal CS1 is negated, the memory card 1 outputs the busy signal BY of the intermediate level to the host HT.

Here, the judging circuit 10 neither outputs the suspension signal SUS1 nor the transfer interruption signal SS1 even when the card selection signal CS1 is negated because the memory card 1 has already completed the data write operation.

Thereafter, when the card selection signal CS1 of the host HT is asserted again, the memory card 1 returns to the ordinary operation to input the data write command CMD and the data D.

Next, an example of the effective operation using the memory cards 1, 2 to execute the operations explained with reference to FIG. 4 to FIG. 7 will be explained with reference to FIG. 9.

FIG. 9 sequentially shows, from the upper side to the lower side, the card selection signal CS1 to select the memory card 1, the card selection signal CS2 to select the memory card 2, the command CMD transferred from the host HT, the data D transferred from the host HT, the internal busy signal BUSY1 outputted from the write control circuit 9 of the memory card 1, the internal busy signal BUSY2 outputted from the write control circuit 9 of the memory card 2, the transfer interruption signal SS1 outputted from the judging circuit 10 of the memory card 1, the suspension signal SUS1 outputted from the judging circuit 10 of the memory card 1, the transfer interruption signal SS2 outputted from the judging circuit 10 of the memory card 2 and the suspension signal SUS2 outputted from the judging circuit 10 of the memory card 2.

First, the host HT outputs the card selection signal CS1 to select the memory card 1 and then transfers the data write command CMD1 to the memory card 1.

Thereafter, the host HT transfers the data D11 of the first block to be written to the memory card 1. When transfer of the data D1-1 is completed, the memory card 1 starts the write operation of data D1-1. During the write operation of data D1-1, the write control circuit 9 outputs the internal busy signal BUSY1 (Hi).

In this case, the asserted card selection signal CS1 and the busy signal BUSY1 indicating that the data outputted from the write control circuit 9 is being written are inputted to the judging circuit 10 of the memory card 1.

Thereafter, the host HT negates the card selection signal CS1, asserts the card selection signal CS2 to select the memory card 2 and transfers the command CMD2 for writing the data D2-1 to the memory card 2.

Moreover, the judging circuit 10 of memory card 1 outputs the suspension signal SUS1 to the CPU5 when the card selection signal CS1 is negated from the asserted state. Upon reception of this suspension signal, the CPU5 continues the write operation until the write operation of data D is completed even if the card selection signal CS1 is negated.

When the write operation of data D1-1 is completed, the internal busy signal BUSY1 becomes the signal of the level Lo. Upon reception of this signal, the judging circuit 10 suspends output of the suspension signal SUS1.

Meanwhile, the host HT transfers the data write command CMD2 to the memory card 2 to which the asserted card selection signal CS2 is inputted and subsequently the host HT transfers the first block data D2-1 to be written to the memory card 2.

When transfer of the data D2-1 is completed, the memory card 2 starts the write operation of the data D2-1. Here, the host HT asserts again the card selection signal CS1 and negates the card selection signal CS2 to transfer the data D1-2 to the memory card 1.

Since the card selection signal CS2 is negated from the asserting state, the judging circuit 10 of the memory card 2 outputs the suspension signal SUS2 to the CPU5. By receiving the suspension signal SUS2, the CPU5 continues the write operation of data D even if the card selection signal CS2 is negated.

With repetition of these operations, the so-called interleave process may be realized, in which the data D1-1 is transferred to the memory card 1 by instructing thereto the write operation and while the memory card 1 is conducting the data write operation, the memory card 1 is set to the non-selective condition but the memory card 2 is selected and, the data D2-1 is then transferred by instructing the write operation to the memory card 2 and the memory card 1 is accessed again while the memory card 2 is conducting the data write operation.

Thereby, according to the present embodiment, even if the card selection signals CS1, CS2 for selecting the memory cards 1, 2 are negated while the data is being transferred or written, mismatching of the processes and timings between the host HT and the memory cards 1, 2 can surely be avoided.

Moreover, the interleave process can be realized by using the memory cards 1, 2 for the host HT which is capable of processing a plurality of memory cards and thereby effective data process can be conducted within a short period of time.

In addition, in this embodiment, the data write operation is mainly explained but the present invention can also be applied to the other operations such as data read operation or data erase operation.

The present invention has been explained based on the preferred embodiment thereof but the present invention is not limited to such embodiment and allows various changes and modifications within the scope of the claims thereof.

For example, in above embodiment, the commands have been inputted to each memory card by shifting the timings and still high speed data process can be realized by simultaneously inputting the commands to these memory cards. Moreover, when a device signal is negated during the data transfer, access may be returned to the heading area of the sector being transferred.

The effects of the typical one of the inventions disclosed in the present specification may be briefly explained as follows.

(1) Since the memory card executes the process by judging the optimum process even when the card selection signal is negated during the data transfer or during the command process such as data write operation, the problem that synchronization of processes with the memory card cannot be attained can be surely avoided even if the host has conducted operations not conforming to the standards.

(2) Moreover, since a plurality of memory cards can be used effectively with the card selection signals, the data processing performance can be improved.

What is claimed is:

1. A memory card comprising a non-volatile semiconductor memory, which includes a plurality of non-volatile memory cells to store data, and a controller which instructs operations of said non-volatile semiconductor memory based on commands issued from a host, wherein said controller is provided with a process judging portion, the process judging portion outputs a transfer interruption signal when a card selection signal for selecting said memory card is transitioned to a disable state from an enable state while said host is transferring data for storing to ones of said plurality of non-volatile memory cells and before starting to store the transferred data to ones of said plurality of non-volatile memory cells, and wherein said controller invalidates transferred data and interrupts the transfer process in response to the transfer interruption signal.

2. The memory card according to claim 1, wherein said process judging portion comprises:

a transfer control unit which detects that data is being transferred from said host and outputs a transfer flag signal; and a process judging unit that receives said transfer flag signal outputted from said transfer control unit and a card selection signal for selecting said memory card, and outputs said transfer interruption signal when said card selection signal transitions from the enable state to the disable state while said transfer flag signal is inputted.

3. A memory card comprising a non-volatile semiconductor memory, which includes a plurality of non-volatile memory cells to store data, and a controller for instructing operations of said non-volatile semiconductor memory based on an arbitrary one of commands issued from a host, wherein said controller is provided with a process judging portion, wherein said process judging portion is adapted to output a suspension signal when, during execution of a first command transferred from said host, a card selection signal for selecting said memory card transitions from an enable state to a disable state and storing of data to ones of said plurality of non-volatile memory cells has already started, and wherein said controller executes said first command regardless of the state of said card selection signal and thereafter stays in a waiting condition before the data transfer when said process judging portion has output said suspension signal.

4. The memory card according to claim 3, wherein said process judging portion comprises:

a command control unit that outputs an operation signal while said arbitrary one of the commands is executed; and a process judging unit that receives an operation signal outputted from said command control unit, receives said card selection signal for selecting said memory card, and outputs said suspension signal when said card selection signal transitions from the enable state to the disable state while said operation signal is inputted.

5. The memory card according to claim 4, wherein said command control unit outputs said operation signal when said controller executes an arbitrary one of a read command, a write command or an erase command.

6. A memory card comprising a non-volatile semiconductor memory including a plurality of non-volatile memory cells to store data and a controller for instructing operations of said non-volatile semiconductor memory based on a command issued from a host, wherein said controller comprises:

a transfer control unit that detects that said host is transferring data and outputs a transfer flag signal;

a command control unit that outputs an operation signal during execution of the command issued by said host; and a process judging unit that receives said transfer flag signal outputted from said transfer control unit, receives a card selection signal for selecting said memory card, and receives said operation signal output from said command control unit, wherein said process judging unit is adapted to output an interruption signal when said card selection signal transitions from an enable state to a disable state while said transfer flag signal is in said enable state and before starting to store data to ones of said plurality of non-volatile memory cells, and is adapted to output a suspension signal when said card selection signal transitions from the enable state to the disable state while said operation signal is in said enable state and after starting to store data to ones of said plurality of non-volatile memory cells, and wherein said controller is adapted to invalidate all data being transferred when said process judging unit outputs the interruption signal, and is adapted to execute said command regardless of the state of said card selection signal and thereafter to wait in a data waiting condition when said process judging unit outputs said suspension signal.

7. The memory card according to claim 6, wherein said command control unit outputs said operation signal when said controller executes an arbitrary one of a read command, a write command or an erase command.

* * * * *